[12] United States Patent
Boday et al.

(10) Patent No.: US 9,738,832 B2
(45) Date of Patent: Aug. 22, 2017

(54) FLAME RETARDANT BLOCK COPOLYMERS FROM RENEWABLE FEEDS

(71) Applicant: International Business Machines Corporation, Armonk, NY (US)

(72) Inventors: Dylan J. Boday, Tucson, AZ (US); Joseph Kuczynski, North Port, FL (US); Timothy C. Mauldin, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/142,067

(22) Filed: Apr. 29, 2016

(65) Prior Publication Data

US 2016/0237352 A1 Aug. 18, 2016

Related U.S. Application Data

(62) Division of application No. 14/090,022, filed on Nov. 26, 2013, now Pat. No. 9,346,922.

(51) Int. Cl.
*C09K 21/14* (2006.01)
*C08G 79/04* (2006.01)
(Continued)

(52) U.S. Cl.
CPC .............. *C09K 21/14* (2013.01); *C08G 79/04* (2013.01); *C08G 81/00* (2013.01); *C08K 3/00* (2013.01);
(Continued)

(58) Field of Classification Search
CPC ..................................................... C09K 21/14
(Continued)

(56) References Cited

U.S. PATENT DOCUMENTS

2010/0168299 A1 7/2010 Tanaka et al.
2011/0223206 A1 9/2011 Lebouille et al.
(Continued)

FOREIGN PATENT DOCUMENTS

CN 101879739 A 11/2010
CN 102585141 A 7/2012
(Continued)

OTHER PUBLICATIONS

Liu et al., "Design, Synthesis, and Application of Novel Flame Retardants Derived From Biomass", BioResources, vol. 7, No. 4, 2012, pp. 4914-4925.
(Continued)

*Primary Examiner* — Duc Truong
(74) *Attorney, Agent, or Firm* — Matthew J. Bussan

(57) ABSTRACT

A flame retardant block copolymer is prepared from renewable content. In an exemplary synthetic method, a bio-derived flame retardant block copolymer is prepared by a ring opening polymerization of a biobased cyclic ester and a phosphorus-containing polymer. In some embodiments, the biobased cyclic ester is lactide. In some embodiments, the phosphorus-containing polymer is a hydroxyl-telechelic flame retardant biopolymer prepared by a polycondensation reaction of a biobased diol (e.g., isosorbide) and a phosphorus-containing monomer (e.g., phenylphosphonic dichloride). In other embodiments, the phosphorus-containing polymer is synthesized from a dioxaphospholane monomer.

13 Claims, 2 Drawing Sheets

(51) Int. Cl.
*C08K 3/00* (2006.01)
*C08K 5/00* (2006.01)
*C08K 7/00* (2006.01)
*H01R 13/527* (2006.01)
*H05K 1/03* (2006.01)
*C08G 81/00* (2006.01)

(52) U.S. Cl.
CPC ............... *C08K 5/00* (2013.01); *C08K 7/00* (2013.01); *H01R 13/527* (2013.01); *H05K 1/0373* (2013.01); *H05K 2201/012* (2013.01)

(58) Field of Classification Search
USPC .................... 528/287; 525/415, 437, 538
See application file for complete search history.

(56) References Cited

U.S. PATENT DOCUMENTS

| | | | |
|---|---|---|---|
| 2011/0288207 | A1 | 11/2011 | Aoshima et al. |
| 2011/0301266 | A1 | 12/2011 | Yamanaka et al. |
| 2012/0238652 | A1 | 9/2012 | Uehara et al. |
| 2012/0252911 | A1 | 10/2012 | Fleckenstein et al. |
| 2013/0005872 | A1 | 1/2013 | Kiuchi et al. |

FOREIGN PATENT DOCUMENTS

| | | |
|---|---|---|
| CN | 102585143 A | 7/2012 |
| CN | 102585293 A | 7/2012 |
| EP | 1741707 A1 | 1/2007 |
| EP | 2327742 A2 | 6/2011 |
| EP | 2118187 B1 | 9/2012 |
| JP | 2008303288 A | 12/2008 |
| JP | 2009138138 A | 6/2009 |
| JP | 2009227784 A | 10/2009 |
| JP | 2009235422 A | 10/2009 |
| JP | 2010111739 A | 5/2010 |
| JP | 2011207967 A | 10/2011 |
| JP | 2013006911 A | 1/2013 |
| WO | 2011083009 A1 | 7/2011 |
| WO | WO2012129464 A2 | 9/2012 |

OTHER PUBLICATIONS

"Biobased monomers set new trends in wood coatings and fire retardants", European Coatings, Jul. 3, 2012, 2 pages.

Noordover, Bart A. J., "Biobased step-growth polymers—chemistry, functionality and applicability", Technische Universiteit Eindhoven, 2007, 210 pages.

U.S. Appl. No. 14/090,172, to Boday et al., entitled "Flame Retardant Polymers Containing Renewable Content", filed Nov. 26, 2013.

U.S. Appl. No. 14/696,517, to Boday et al., entitled "Flame Retardant Polymers Containing Renewable Content", filed Apr. 27, 2015.

U.S. Appl. No. 14/697,665, to Boday et al., entitled "Flame Retardant Polymers Containing Renewable Content", filed Apr. 28, 2015.

Fleckenstein et al; Organic Phosphorus Compounds for Fire Retardants for Plastic Foams; 2011; BASF SE Germany; Chem Abstract 155:153680.

U.S. Appl. No. 14/090,022, to Boday et al., entitled "Flame Retardant Block Copolymers From Renewable Feeds", filed Nov. 26, 2013, assigned to International Business Machines Corporation.

U.S. Appl. No. 15/142,153, to Boday et al., entitled "Flame Retardant Block Copolymers From Renewable Feeds", filed Apr. 29, 2016, assigned to International Business Machines Corporation.

FLAME RETARDANT BLOCK COPOLYMERS FROM RENEWABLE FEEDS

CROSS-REFERENCE TO RELATED APPLICATION

This patent application is a divisional application of pending U.S. patent application Ser. No. 14/090,022, filed Nov. 26, 2013, entitled "FLAME RETARDANT BLOCK COPOLYMERS FROM RENEWABLE FEEDS" now U.S. Pat. No. 9,346,922, which is hereby incorporated herein by reference in its entirety.

BACKGROUND

The present invention relates in general to the field of flame retardancy. More particularly, the present invention relates to flame retardant block copolymers prepared from renewable feedstock.

SUMMARY

In accordance with some embodiments of the present invention, a flame retardant block copolymer is prepared from renewable content. In an exemplary synthetic method, a bio-derived flame retardant ABA-type tri-block copolymer is prepared by a ring opening polymerization of a biobased cyclic ester and a phosphorus-containing polymer. In some embodiments, the biobased cyclic ester is lactide. In some embodiments, the phosphorus-containing polymer is a hydroxyl-telechelic flame retardant biopolymer prepared by a polycondensation reaction of a biobased diol (e.g., isosorbide) and a phosphorus-containing monomer (e.g., phenylphosphonic dichloride). In other embodiments, the phosphorus-containing polymer is a polyphosphoester synthesized from a ring opening polymerization of a dioxaphospholane monomer.

BRIEF DESCRIPTION OF THE SEVERAL VIEWS OF THE DRAWINGS

Embodiments of the present invention will hereinafter be described in conjunction with the appended drawings, where like designations denote like elements.

DETAILED DESCRIPTION

Figure 1:
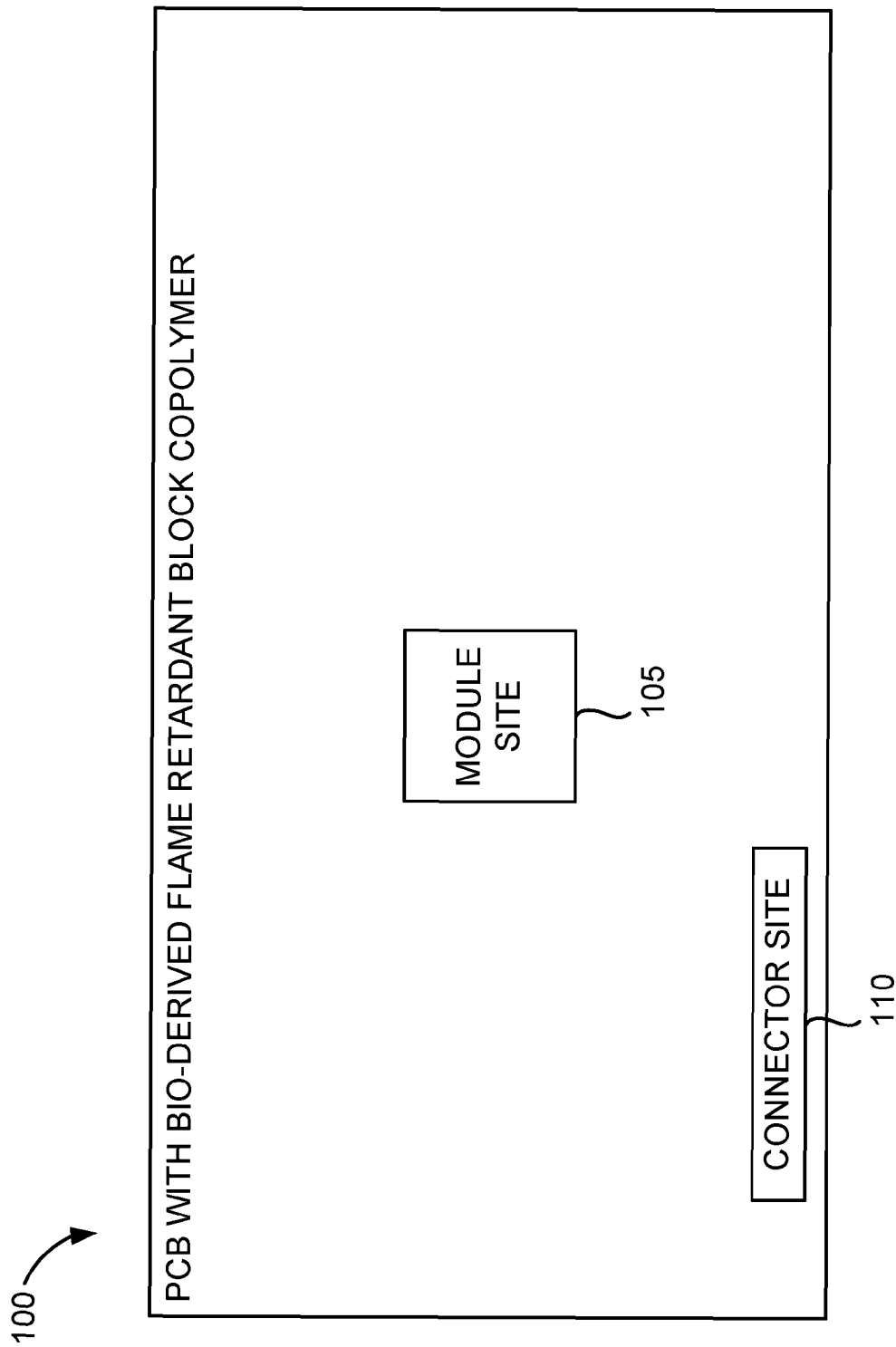
FIG. 1 is a block diagram illustrating an exemplary printed circuit board (PCB) having layers of dielectric material that incorporate a bio-derived flame retardant block copolymer in accordance with some embodiments of the present invention.

The use of synthetic polymers from petroleum sources is widespread. Petroleum-derived synthetic polymers can be found in nearly every item we use in our daily lives. There is a growing shift to prepare polymeric materials from renewable feedstock because petroleum is a finite resource. The use of these renewable polymers is envisaged in applications from disposable products to durable goods. However, significant challenges must be overcome before renewable polymers find wide spread use. One of the main challenges facing renewable polymers is flame retardancy. Known renewable polymers and polymer blends containing renewable polymers typically do not retard burning. There is a significant paucity of inherently flame retardant renewable polymers, despite the need for flame retardant characteristics in many applications. A common approach to render renewable polymers and blends containing renewable polymers as flame retardant is to incorporate flame retardant additives such as halogenated or phosphorus-containing materials. These flame retardant additives are typically small molecules and are in the form of particles. Necessary loadings of these flame retardant additives can run as high as 30%, thus compromising the mechanical properties of the resulting composite materials.

Traditional renewable materials, such as vegetable oils, fatty acids, starch, cellulose and natural rubber, have been available for decades. More recently, a new class of biobased starting compounds has become available. For example, isosorbide, which is a biobased monomer obtained from starch extracted from corn (or other starch source), is commercially available from suppliers and agricultural processors such as Archer Daniels Midland Company (ADM). Large scale availability of additional biobased monomers through improved production processes, as well as the development of a biobased product infrastructure, will accelerate the shift toward the use of renewable feedstock.

Isosorbide (IS) is a so-called 1,4:3,6-dianhydrohexitol (DAH). More generally, 1,4:3,6-dianhydrohexitols (DAHs) include: 1:4:3,6-dianhydro-D-glucitol (isosorbide, IS); 1,4:3,6-dianhydro-L-iditol (isoidide, II); and 1,4:3,6-dihydro-D-mannitol (isomannide, IM).

Isosorbide (IS) has the following molecular structure:

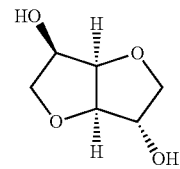

(Isosorbide, IS)

Isoidide (II) has the following molecular structure:

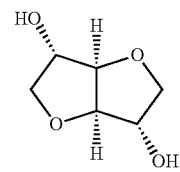

(Isoidide, II)

Isomannide (IM) has the following molecular structure:

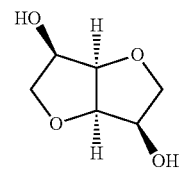

(Isomannide, IM)

Each of the DAHs can be obtained from biomass. Isosorbide (IS) is currently the most widely commercially available DAH.

In addition to DAHs, many other monomers can be obtained from biomass. Such renewable monomers include 2,5-bis(hydroxymethyl)furan, ethylene glycol, propylene glycol (also referred to as "1,2-propanediol"), 1,3-propanediol, glycerol (also referred to as "glycerin" and "glycerine"), 2,3-butanediol, lactic acid, succinic acid, citric acid, levulinic acid, lactide, and ethanol. Among the monomers that can be obtained from biomass are biobased diols (e.g., DAHs, 2,5-bis(hydroxymethyl)furan, ethylene glycol, propylene glycol, 1,3-propanediol, glycerol, and 2,3-butanediol), any one of which may be employed as a reactant in accordance with some embodiments of the present invention.

Some bio-derived polymers are already being produced on a commercial scale (e.g., polylactic acid (PLA)), but tailoring these materials to specific applications requires overcoming several technological challenges. For example, as mentioned earlier, there is a significant paucity of inherently flame retardant renewable polymers, despite the need for flame retardant characteristics in many applications. While flame retardants with some renewable content are known, such flame retardants have very little renewable content and are immiscible with chemically inequivalent commercial bioderived polymers, such as polylactic acid. One example of a known flame retardant with some renewable content is poly(DPA-PDCP) obtained through interfacial polycondensation between diphenolic acid (DPA) and phenyl dichlorophosphate (PDCP). Another example of a known flame retardant with some renewable content is poly(MDP-PDCP-MA) synthesized through a zinc acetate catalyzed reaction of melamine (MA) and poly(MDP-PDCP), which is obtained through interfacial polycondensation between methyl diphenolate (MDP) and phenyl dichlorophosphate (PDCP). These known flame retardants have very little renewable content. Both of these known flame retardants use diphenolic acid as one of the raw materials, which may be derived (in part) from levulinic acid (which, as noted above, is among the monomers that can be obtained from biomass). However, the vast majority of the mass of diphenolic acid is obtained from petroleum-derived feedstock. These known flame retardants have no other renewable content. Moreover, these known flame retardants are immiscible with chemically inequivalent commercial bioderived polymers, such as polylactic acid.

For purposes of this document, including the claims, the term "biobased" refers to chemicals, energy sources and other materials that utilize biological or renewable agricultural material. Also, for purposes of this document, including the claims, the term "renewable" refers to a chemical, energy source or other material that is inexhaustible or rapidly replaceable by new growth. Also, for purposes of this document, including the claims, the term "biomass" refers to a biological material derived from living, or recently living organisms.

In the manufacture of PCBs, connectors, electronic device plastic enclosures and plastic enclosure panels, and other articles of manufacture that employ thermosetting plastics (also known as "thermosets") or thermoplastics, incorporation of a flame retardant is required for ignition resistance. Typically, brominated organic compounds impart flame retardancy. Consequently, the base material (e.g., epoxy resin for PCBs, and liquid crystal polymer (LCP) for connectors, and acrylonitrile butadiene styrene (ABS) for electronic device plastic panels and plastic enclosure panels) properties are compromised because a relatively large quantity of a flame retardant is necessary to achieve the desired ignition resistance.

In accordance with some embodiments of the present invention, a flame retardant block copolymer is prepared from renewable content. In an exemplary synthetic method, a bio-derived flame retardant ABA-type tri-block copolymer is prepared by a ring opening polymerization of a biobased cyclic ester and a phosphorus-containing polymer.

In some embodiments, the biobased cyclic ester is lactide. For example, lactide is used in the second step of reaction schemes 1, 2 and 3, described below.

In some embodiments, the phosphorus-containing polymer is a hydroxyl-telechelic flame retardant biopolymer. For example, a hydroxyl-telechelic flame retardant biopolymer is used in the second step of reaction schemes 1 and 2, described below.

The hydroxyl-telechelic flame retardant biopolymer may be a cyclic phosphonate prepared by a polycondensation reaction of a biobased diol (e.g., isosorbide) and a phosphorus-containing monomer (e.g., phenylphosphonic dichloride). The biobased diol may be obtained either directly from, or through modification of, a biological product. Preferably, at least 50% of the mass of the biobased diol is obtained directly from a biological product. More preferably, the entire mass of the biobased diol is obtained directly from a biological product. The phosphorus-containing monomer may be a phosphonic dichloride, dichlorophosphate, alkyl/aryl phosphonate, or other phosphorus-containing monomer known for flame retardancy (e.g., a phosphinate, a phosphonate, a phosphate ester, and combinations thereof). For example, a hydroxyl-telechelic flame retardant biopolymer is synthesized using melt-based condensation polymerization in the first step of reaction scheme 1, described below, and solution-based condensation polymerization in the first step of reaction scheme 2, described below.

In other embodiments, the phosphorus-containing polymer is a polyphosphoester (e.g., a polymeric phosphate ester) derived from a dioxaphospholane monomer. For example, a polyphosphoester is used in the second step of reaction scheme 3, described below.

The polyphosphoester may be prepared by a ring opening polymerization of a dioxaphospholane monomer. For example, a polyphosphoester is synthesized using a ring opening polymerization in the first step of reaction scheme 3, described below.

Flame retardant ABA-type tri-block copolymers in accordance with some embodiments of the present invention are defined by a phosphorus-containing flame-retardant "B-block" polymer (which preferably contains some renewable content) and an "A-block" comprised of bioderived polymers (e.g., polylactic acid). An exemplary bio-derived flame retardant tri-block copolymer (synthesized in reaction scheme 2, described below) in accordance with some embodiments of the present invention has the following ABA-type molecular structure:

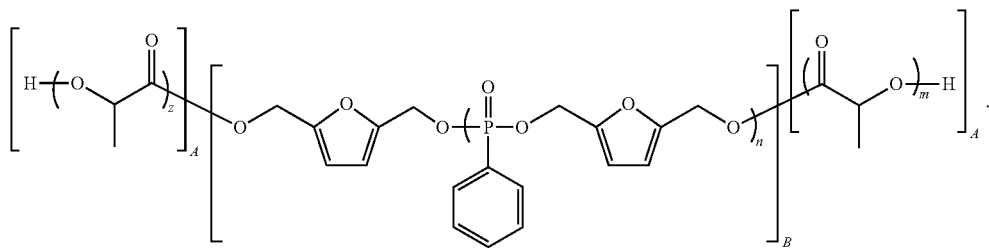

However, bio-derived flame retardant block copolymers in accordance with some embodiments of the present invention need not be ABA-type tri-block copolymers. Flame retardant ABA-type tri-block copolymers in accordance with some embodiments of the present invention are set forth in this document for purposes of illustration, not limitation. Bio-derived flame retardant block copolymers in accordance with some embodiments of the present invention include AB diblock copolymers, ABA tri-block copolymers all the way through(-AB-) multiblock copolymers.

Bio-derived flame retardant block copolymers in accordance with some embodiments of the present invention, used directly or blended with the "A-block" homopolymer, yield flame-retardant materials that may be derived predominately from renewable content. Furthermore, the tri-block (or diblock or multiblock) structure ensures either a homogeneous or nano/microstructured incorporation of the bio-derived flame retardant block copolymer throughout the bulk material, resulting in optimal flame retardancy and mechanical strength.

In accordance with some embodiments of the present invention, flame retardant moieties are incorporated directly into the renewable polymer backbones. Condensation polymerization of a biobased diol such as isosorbide and a phosphorus-containing monomer such as phenylphosphonic dichloride, for example, incorporates flame retardant moieties (i.e., phosphorus) directly into the backbone of the resulting bio-derived flame retardant polymer (i.e., the B-block). The resulting homogeneous and uniform incorporation of phosphorus yields flame retardant bio-derived polymers without the need for discrete particles (i.e., conventional flame retardant additives) that often come with the caveat of diminished mechanical toughness, stiffness, etc. Additionally, because these bio-derived flame retardants are polymers and not small molecules (conventional flame retardant additives typically are small molecules), the mechanical properties of the composite will not be compromised.

In accordance with some embodiments of the present invention, bio-derived flame retardant block copolymers may be used alone or blended with other polymers. For example, a bio-derived flame retardant block copolymer in accordance with some embodiments of the present invention may be blended with one or more petroleum-derived polymers (e.g., acrylonitrile butadiene styrene (ABS)) and/or one or more conventional bio-derived polymers (e.g., polylactic acid (PLA), polyhydroxybutyrate (PHB), and the like). For example, a bio-derived flame retardant block copolymer in accordance with some embodiments of the present invention may be blended with a renewable-based composite polymer, such as a mixture of polyhydroxybutyrate (PHB) bioplastic and carbon dioxide-based polypropylene carbonate (PPC) (containing 43% by weigh $CO_2$), which is a renewable-based composite polymer alternative for ABS developed by Siemens.

Alternatively, in accordance with other embodiments of the present invention, bio-derived flame retardant block copolymers may be used as flame retardant additives (i.e., discrete particles) in composite materials. For example, a bio-derived flame retardant block copolymer may be ground to particles that may serve as a flame retardant additive in a composite material. These bio-derived flame retardant block copolymer particles may also serve to increase the renewable content in the composite material as compared to conventional flame retardant additives that lack renewable content.

An exemplary printed circuit board (PCB) implementation of the present invention is described below with reference to FIG. 1, while an exemplary connector implementation and an exemplary plastic enclosure panel implementation of the present invention are described below with reference to FIG. 2. However, those skilled in the art will appreciate that the present invention applies equally to any manufactured article that employs thermosetting plastics (also known as "thermosets") or thermoplastics.

As described below, a bio-derived flame retardant block copolymer in accordance with some embodiments of the present invention may be synthesized by, for example, a polycondensation reaction in the melt of a biobased diol and a phosphorus-containing monomer and, subsequently, a ring opening polymerization of a biobased cyclic ester and the polycondensation reaction product. This first pathway to prepare a bio-derived flame retardant block copolymer in accordance with some embodiments of the present invention is exemplified by reaction scheme 1, below.

However, those skilled in the art will appreciate that a bio-derived flame retardant block copolymer in accordance with some embodiments of present invention may be synthesized using other processes and reaction schemes. For example, a bio-derived flame retardant block copolymer in accordance with some embodiments of the present invention may be synthesized by, for example, a polycondensation reaction in solution of a biobased diol and a phosphorus-containing monomer and, subsequently, a ring opening polymerization of a biobased cyclic ester and the polycondensation reaction product. This second pathway to prepare a bio-derived flame retardant block copolymer in accordance with some embodiments of the present invention is exemplified by reaction scheme 2, below.

In another example, a bio-derived flame retardant block copolymer in accordance with some embodiments of the present invention may be synthesized by, for example, a ring opening polycondensation of a dioxaphospholane to obtain a polyphosphoester and, subsequently, a ring opening polymerization of a biobased cyclic ester and the polyphosphoester. This third pathway to prepare a bio-derived flame retardant block copolymer in accordance with some embodiments of the present invention is exemplified by reaction scheme 3, below.

The first pathway is exemplified below in the non-limiting reaction scheme (i.e., reaction scheme 1). A reaction scheme (reaction scheme 1) follows for synthesizing a bio-derived flame retardant block copolymer in accordance with some embodiments of the present invention through 1.) a melt-based condensation polymerization of a biobased diol and a phosphorous-containing monomer and, subsequently, 2.) a ring opening polymerization of a biobased cyclic ester and the polycondensation reaction product. In the first step of reaction scheme 1, isosorbide and phenylphosphonic dichloride are reacted via condensation polymerization in a melt state. In the second step of reaction scheme 1, the bio-derived flame retardant polymer reaction product of the condensation polymerization and lactide are reacted via ring opening polymerization.

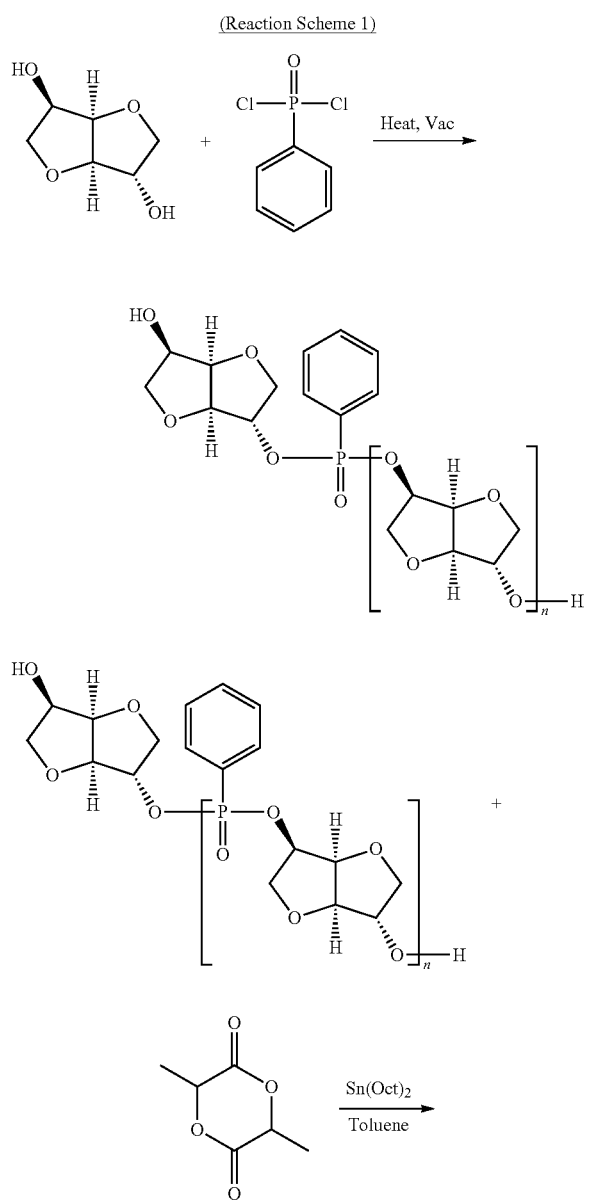

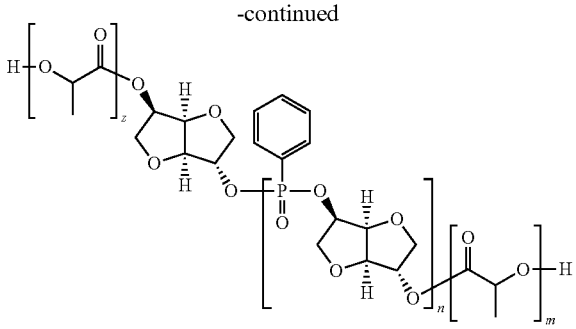

In the first step of reaction scheme 1, a bio-derived flame retardant polymer is synthesized through a melt polycondensation reaction of isosorbide and phenylphosphonic dichloride using conventional procedures well known to those skilled in the art. The first step of reaction scheme 1 may be performed at 150° C. while stirring under a vacuum (e.g., 1-5 mbar) for several hours (e.g., 4 hours). Generally, stoichiometric quantities of the reactants may be used.

Melt polycondensation techniques are well known in the art. For example, a thesis by Bart A. J. Noordover, "Biobased step-growth polymers—chemistry, functionality and applicability", Technische Universiteit Eindhoven, 2007, discloses melt polycondensation techniques in the context of synthesizing biobased step-growth polymers for a thermosetting powder coatings. The Noordover thesis is hereby incorporated herein by reference in its entirety.

The bio-derived flame retardant polymer (i.e., the B-block) synthesized through the melt polycondensation reaction is made with hydroxyl endgroups, which are used as handles to subsequently grow additional bioderived polymers (i.e., the A-blocks). This may be accomplished by, for example, adjusting the quantity of the reactants used in the melt polycondensation reaction so that isosorbide is slightly in excess relative to the stoichiometric quantity. The end-block polymers (i.e., the A-blocks) enhance compatibility of the renewable flame retardant with the surrounding matrix in order to inhibit macrophase separation of the flame retardant into larger particles, which often leads to diminished mechanical properties in polymers.

Optionally, an inert gas (e.g., $N_2$) may be flowed through the reactor to limit oxidation and facilitate removal of HCl vapor formed during the reaction.

Also, a catalyst dissolved in a solvent may be optionally added to the melt. For example, tin(II) 2-ethylhexanoate (also referred to as "Sn(Oct)$_2$") or titanium(IV) n-butoxide (0.02 mol % relative to phenylphosphonic dichloride), dissolved in toluene, may be added to the melt. Zinc(II) and titanium(IV) catalysts may also be used, as well as organic catalysts, such as 4-dimethylaminopyridine (DMAP), 1,8-Diazabicyclo[5.4.0]undec-7-ene (DBU) and triazabicyclodecene (TBD).

Isosorbide is a commercially available biobased diol. As mentioned above, isosorbide is a biobased monomer obtained from starch extracted from corn (or other starch source). Isosorbide, which is a solid at room temperature, is well suited for melt polycondensation reactions. Isosorbide has a melting point temperature between 60 and 63° C., and is stable up to 270° C. In addition, isosorbide is hygroscopic.

Phenylphosphonic dichloride is a commercially available phosphorus-containing monomer. Phenylphosphonic dichloride is a liquid at room temperature. Phenylphosphonic dichloride has a melting temperature of 3° C., and has a boiling temperature of 258° C.

Typically, after the melt polycondensation reaction is complete, the bio-derived flame resistant polymer is removed from the reactor, washed and dried. For example, the reaction product may be precipitated into an appropriate non-solvent (e.g., methanol) and washed with non-solvent. The reaction product may then be dried under vacuum for twenty-four hours at room temperature.

In second step of reaction scheme 1, a bio-derived flame retardant block copolymer is synthesized through a ring opening polymerization of lactide and the phosphorus-containing polymer (synthesized in the first step of reaction scheme 1) using conventional procedures well known to those skilled in the art. The second step of reaction scheme 1 may be performed in the presence of stannous octoate $(Sn(Oct)_2)$ as a catalyst and toluene as a solvent. Generally, stoichiometric quantities of the reactants may be used.

Ring opening polymerization techniques are well known in the art. For example, U.S. Patent Application Publication No. 2011/0223206 A1, to LEBOUILLE et al., entitled "MICELLE COMPOSITIONS AND PROCESS FOR THE PREPARATION THEREOF", published Sep. 15, 2011, discloses ring opening polymerization techniques in the context of a micelle composition. The LEBOUILLE et al. patent application publication is hereby incorporated herein by reference in its entirety.

For example, in the second step of the first reaction scheme, the bio-derived flame resistant polymer from the first step may be weighed into a two-necked round bottle flask, and subsequently placed in an oil bath at 150° C. A vacuum is employed before continuing synthesis. Lactide may be added to the bio-derived flame resistant polymer by removing the vacuum and simultaneously flushing with nitrogen gas. The vacuum is then reapplied, and the reactants are stirred. Once a homogeneous melt is obtained, stannous octoate ($Sn_2Oct$) dissolved in toluene may be added to the reactants by removing the vacuum and simultaneously flushing with nitrogen gas. The vacuum is then reapplied. The reaction conditions are maintained for a few hours, after which the vacuum is replaced with nitrogen gas.

Alternatively, the second step of the first reaction scheme can be done with the same reagents in refluxing toluene, which would take approximately 24 hours. Toluene is not necessarily preferred over melt polymerization.

Alternatively, the second step of the first reaction scheme can be done with the same reagents in most any aprotic solvent between 0-35° C. with the more reactive organic catalysts (e.g., DMAP, DBU and TBD).

A catalyst dissolved in a solvent is added to the reactants. For example, tin(II) 2-ethylhexanoate (also referred to as "$Sn(Oct)_2$") or titanium(IV) n-butoxide (0.02 mol % relative to phenylphosphonic dichloride), dissolved in toluene, may be added to the reactants. Zinc(II) and titanium(IV) catalysts may also be used, as well as organic catalysts, such as 4-dimethylaminopyridine (DMAP), 1,8-Diazabicyclo[5.4.0]undec-7-ene (DBU) and triazabicyclodecene (TBD).

Lactide is a commercially available biobased cyclic ester monomer. As mentioned above, lactide is a monomer that can be obtained from biomass. Lactide is the cyclic di-ester of lactic acid. Lactide may be prepared by heating lactic acid in the presence of an acid catalyst. Lactide, which is a solid at room temperature, has a melting point temperature between 95 and 97° C.

Typically, after the ring opening polymerization is complete, the bio-derived flame resistant block copolymer is removed from the reactor, washed and dried. For example, the reaction product may be precipitated into an appropriate non-solvent (e.g., methanol) and washed with non-solvent. The reaction product may then be dried under vacuum for twenty-four hours at room temperature. Optionally, the reaction product may now be crushed into particles, and re-dried under vacuum. The resultant particles may be course particles, fine particles, ultrafine particles, or nanoparticles.

Those skilled in the art will appreciate that reaction scheme 1 is set forth for the purpose of illustration not limitation. For example, the first step of reaction scheme 1 synthesizes a particular bio-derived flame retardant polymer by a melt polycondensation reaction of a particular biobased diol (isosorbide) and a particular phosphorus-containing monomer (phenylphosphonic dichloride). This particular synthesis of this particular bio-derived flame retardant polymer is exemplary. In general, a bio-derived flame retardant polymer in accordance with some embodiments of the present invention may be synthesized in the first step of reaction scheme 1 using a polycondensation reaction in the melt or in solution of any suitable biobased diol and any suitable phosphorus-containing monomer.

Also, the second step of reaction scheme 1 synthesizes a particular bio-derived flame retardant block copolymer by a ring opening polymerization of a particular biobased cyclic ester (lactide) and a particular phosphorus-containing polymer (i.e., the bio-derived flame retardant polymer synthesized in the first step of reaction scheme 1). This particular synthesis of this particular bio-derived flame retardant block copolymer is exemplary. In general, a bio-derived flame retardant block copolymer in accordance with some embodiments of the present invention may be synthesized in the second step of reaction scheme 1 using a ring opening polymerization of any suitable biobased cyclic ester and any suitable phosphorus-containing polymer.

The second pathway is exemplified below in another non-limiting reaction scheme (i.e., reaction scheme 2). A reaction scheme (reaction scheme 2) follows for synthesizing a bio-derived flame retardant block copolymer in accordance with some embodiments of the present invention through 1.) a solution-based condensation polymerization of a biobased diol and a phosphorus-containing monomer and, subsequently, 2.) a ring opening polymerization of a biobased cyclic ester and the polycondensation reaction product. In the first step of reaction scheme 2, phenylphosphonic dichloride and 2,5-bis(hydroxymethyl)furan are reacted via condensation polymerization in solution. In the second step of reaction scheme 2, the bio-derived flame retardant polymer reaction product of the condensation polymerization and lactide are reacted via ring opening polymerization Phenylphosphonic dichloride is a commercially available phosphorus-containing monomer. Phenylphosphonic dichloride is a liquid at room temperature.

NEt$_3$ and DMAP are commercially available organic catalysts. One skilled in the art will appreciate that any suitable catalyst (proton acceptor) may be used in lieu of, or

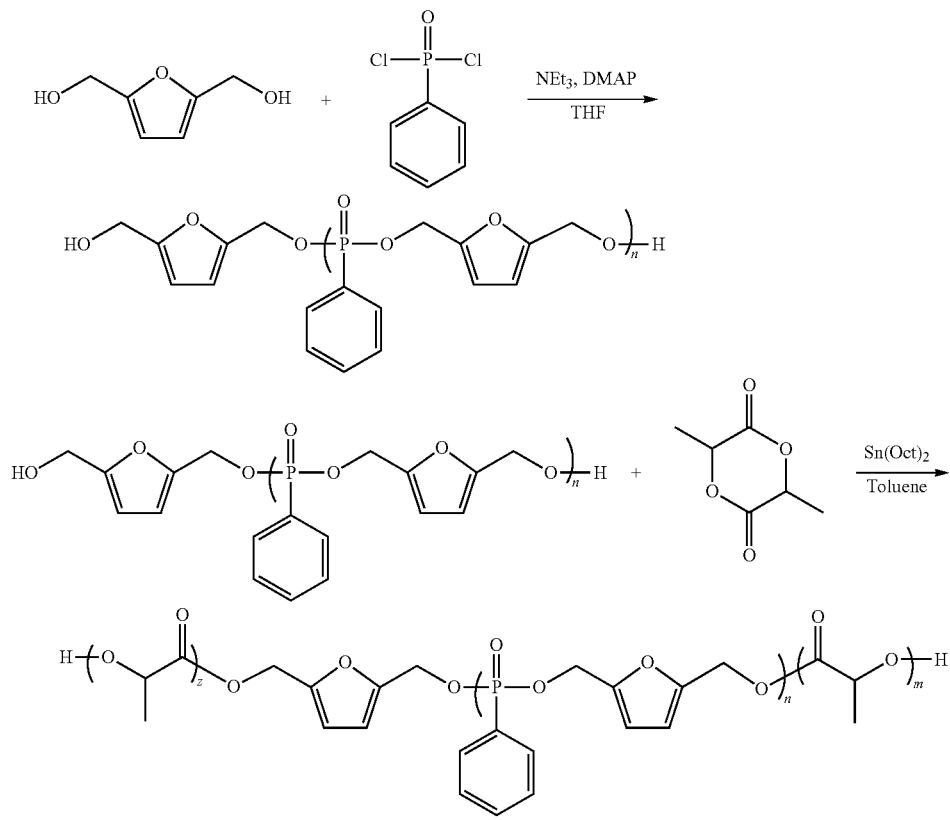

In the first step of reaction scheme 2, a bio-derived flame retardant polymer is synthesized through a solution-based polycondensation reaction of 2,5-bis(hydroxymethyl)furan and phenylphosphonic dichloride at room temperature (e.g., 25° C.) for several hours (e.g., 2 to 3 hours) using conventional procedures well known in the art. 2,5-bis(hydroxymethyl)furan is reacted with phenylphosphonic dichloride in the presence of triethylamine (NEt$_3$) (also referred to as "Et$_3$N", "TEA" and "N,N-diethylethanamine"), 4-dimethylaminopyridine (DMAP), and tetrahydrofuran (THF) to form the bio-derived flame retardant polymer. NEt$_3$ and DMAP are catalysts. THF is the solvent. Generally, stoichiometric quantities of the reactants may be used.

2,5-bis(hydroxymethyl)furan is a commercially available biobased diol. As mentioned above, 2,5-bis(hydroxymethyl)furan is a monomer that can be obtained from biomass. 2,5-bis(hydroxymethyl)furan, which is a solid at room temperature, has a melting point temperature between 74 and 77° C.

in addition to, NEt$_3$ and DMAP. For example, tri-n-butylamine (TBA) is also a suitable catalyst.

THF is a commercially available solvent. One skilled in the art will appreciate that any suitable solvent may be used in lieu of, or in addition to, THF. The choice of solvent is not critical as long as the monomers are soluble in the solvent. It is vital, however, that the solvent not be alcoholic in nature to prevent unwanted side reactions of reagents with the solvent. Acceptable solvents include, but are not limited to, ether and polar aprotic solvents. The following solvents are the most common: tetrahydrofuran, dimethylformamide, and acetonitrile. Further various other hydrocarbons solvents in which the monomers are miscible may be used as cosolvents. One example of such a cosolvent is benzene. Which solvent is preferred depends on the solubility of the subject monomers. In many cases, the preferred solvent is tetrahydrofuran.

Solution-based polycondensation techniques are well known in the art. For example, an article by Yan Liu et al., "DESIGN, SYNTHESIS, AND APPLICATION OF NOVEL FLAME RETARDANTS DERIVED FROM BIOMASS", BioResources, Vol. 7, No. 4, 2012, pp. 4914-4925, discloses solution-based polycondensation techniques in the context of flame retardants. The Liu et al. article is hereby incorporated herein by reference in its entirety.

The bio-derived flame retardant polymer (i.e., the B-block) synthesized through the solution-based polycondensation reaction is made with hydroxyl endgroups, which are used as handles to subsequently grow additional bio-derived polymers (i.e., the A-blocks). This may be accomplished by, for example, adjusting the quantity of the reactants used in the polycondensation reaction so that 2,5-bis (hydroxymethyl)furan is slightly in excess relative to the stoichiometric quantity. The endblock polymers (i.e., the A-blocks) enhance compatibility of the renewable flame retardant with the surrounding matrix in order to inhibit macrophase separation of the flame retardant into larger particles, which often leads to diminished mechanical properties in polymers.

Precipitation into an appropriate non-solvent (e.g., methanol) is used for product isolation (i.e., to remove the reaction product from the solvent).

After the solvent is removed, the reaction product is then washed and dried. For example, the reaction product may be washed with non-solvent and then dried under vacuum for twenty-four hours at room temperature.

In second step of reaction scheme 2, a bio-derived flame retardant block copolymer is synthesized through a ring opening polymerization of lactide and the phosphorus-containing polymer (synthesized in the first step of reaction scheme 1) using conventional procedures well known to those skilled in the art. The second step of reaction scheme 2, as well as the post-reaction processing, may be performed in the same manner as the second step of reaction scheme 1.

Those skilled in the art will appreciate that reaction scheme 2 is set forth for the purpose of illustration not limitation. For example, the first step of reaction scheme 2 synthesizes a particular bio-derived flame retardant polymer by a solution-based polycondensation reaction of a particular biobased diol (2,5-bis(hydroxymethyl)furan) and a particular phosphorus-containing monomer (phenylphosphonic dichloride). This particular synthesis of this particular bio-derived flame retardant polymer is exemplary. In general, a bio-derived flame retardant polymer in accordance with some embodiments of the present invention may be synthesized in the first step of reaction scheme 2 using a polycondensation reaction in the melt or in solution of any suitable biobased diol and any suitable phosphorus-containing monomer.

Also, the second step of reaction scheme 2 synthesizes a particular bio-derived flame retardant block copolymer by a ring opening polymerization of a particular biobased cyclic ester (lactide) and a particular phosphorus-containing polymer (i.e., the bio-derived flame retardant polymer synthesized in the first step of reaction scheme 2). This particular synthesis of this particular bio-derived flame retardant block copolymer is exemplary. In general, a bio-derived flame retardant block copolymer in accordance with some embodiments of the present invention may be synthesized in the second step of reaction scheme 2 using a ring opening polymerization of any suitable biobased cyclic ester and any suitable phosphorus-containing polymer.

Biobased diols suitable for reacting with a phosphorus-containing monomer via a polycondensation reaction to produce a bio-derived flame retardant polymer in accordance with some embodiments of the present invention may be either obtained commercially or synthesized. For example, suitable biobased diols that may be obtained commercially include, but are not limited to, isosorbide (as well as the other DAHs), 2,5-bis(hydroxymethyl)furan, ethylene glycol, propylene glycol (also referred to as "1,2-propanediol"), 1,3-propanediol, glycerol (also referred to as "glycerin" and "glycerine"), and 2,3-butanediol. Each of these diols can be obtained from biomass. Preferably, at least 50% of the mass of the biobased diol is obtained directly from a biological product. More preferably, the entire mass of the biobased diol is obtained directly from a biological product.

Phosphorus-containing monomers suitable for reacting with a biobased diol via a polycondensation reaction to produce a bio-derived flame retardant polymer in accordance with some embodiments of the present invention may be either obtained commercially or synthesized. For example, suitable phosphorus-containing monomers that may be obtained commercially include, but are not limited to, phenylphosphonic dichloride, ethylphosphonic dichloride, methylphosphonic dichloride, methylenebis(phosphonic dichloride), phenyl dichlorophosphate (PDCP), ethyl dichlorophosphate, and methyl dichlorophosphate. Generally, suitable phosphorus-containing monomers include, but are not limited to, phosphonic dichlorides, dichlorophosphates, alkyl/aryl phosphonates, or other phosphorus-containing monomers known for flame retardancy (e.g., phosphinates, phosphonates, phosphate esters, and combinations thereof).

Phosphonic dichlorides and dichlorophosphates are listed among the suitable phosphorus-containing monomers for purposes of illustration, not limitation. Suitable phosphorus-containing monomers may alternatively contain other halogen atoms or hydrogen atoms that participate in the polycondensation reaction in lieu of chlorine atoms.

Suitable phosphorus-containing monomers also include (or may be synthesized from) conventional phosphorus-based flame retardants, such as phosphonates (e.g., dimethyl methyl phosphonate; diethyl ethyl phosphonate; dimethyl propyl phosphonate; diethyl N,N-bis(2-hydroxyethyl) amino methyl phosphonate; phosphonic acid, methyl(5-methyl-2-methyl-1,3,2-dioxaphosphorinan-5-y) ester, P,P'-dioxide; and phosphonic acid, methyl(5-methyl-2-methyl-1, 3,2-dioxaphosphorinan-5-yl) methyl, methyl ester, P-oxide), phosphate esters (e.g., triethyl phosphate; tributyl phosphate; trioctyl phosphate; and tributoxyethyl phosphate), and phosphinates.

A conventional phosphorus-based flame retardant typically includes one or more of a phosphonate, a phosphate ester, or a phosphinate. Conventional phosphorus-based flame retardants that are phosphonates have the following generic molecular structure:

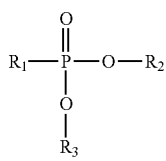

where $R_1$, $R_2$ and $R_3$ are organic substituents (e.g., alkyl, aryl, etc.) that may be the same or different.

Conventional phosphorus-based flame retardants that are phosphate esters have the following generic molecular structure:

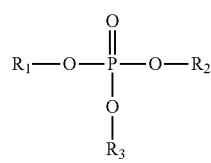

where $R_1$, $R_2$ and $R_3$ are organic substituents (e.g., alkyl, aryl, etc.) that may be the same or different.

Conventional phosphorus-based flame retardants that are phosphinates have the following generic molecular structure:

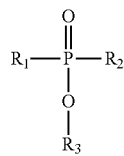

where $R_1$, $R_2$ and $R_3$ are organic substituents (e.g., alkyl, aryl, etc.) that may be the same or different.

One or more of the above conventional phosphorus-based flame retardants (i.e., phosphonate, phosphate ester, and/or phosphinate) and/or other conventional phosphate-based flame retardants may be functionalized (e.g., halogenated) using procedures well known to those skilled in the art to produce functionalized phosphorus-containing monomers suitable for reacting with a biobased diol via a polycondensation reaction to produce a bio-derived flame retardant polymer in accordance with some embodiments of the present invention. Hence, either halogen atoms of functionalized phosphorus-containing monomers or hydrogen atoms of the conventional phosphorus-based flame retardants may participate in the polycondensation reaction.

Biobased cyclic ester monomers and oligomers suitable for reacting with a phosphorus-containing polymer via a ring opening polymerization to produce a bio-derived flame retardant block copolymer in accordance with some embodiments of the present invention may be either obtained commercially or synthesized. For example, suitable biobased cyclic esters that may be obtained commercially include, but are not limited to, lactide and glycolide. Each of these monomers can be obtained from biomass. Preferably, at least 50% of the mass of the biobased cyclic ester is obtained directly from a biological product. More preferably, the entire mass of the biobased cyclic ester is obtained directly from a biological product.

The third pathway is exemplified below in another non-limiting reaction scheme (i.e., reaction scheme 3). A reaction scheme (reaction scheme 3) follows for synthesizing a bio-derived flame retardant block copolymer in accordance with some embodiments of the present invention through 1.) a ring opening polymerization of a dioxaphospholane monomer to obtain a polyphosphoester and, subsequently, 2.) a ring opening polymerization of a biobased cyclic ester and the polyphosphoester. In the first step of reaction scheme 3, a cyclic phosphoester such as 2-ethoxy-2-oxy-1,3,2-dioxaphospholane is reacted via a ring opening polymerization to obtain a polyphosphoester. The first step of reaction scheme 3 is initiated from a diol (e.g., ethylene glycol or other suitable diol) to ensure that product is hydroxyl-telechelic. In the second step of reaction scheme 3, the polyphosphoester and lactide are reacted via ring opening polymerization.

(Reaction Scheme 3)

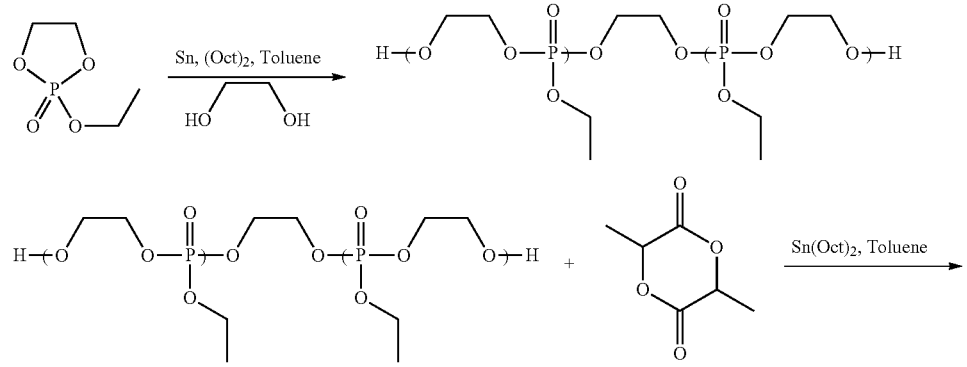

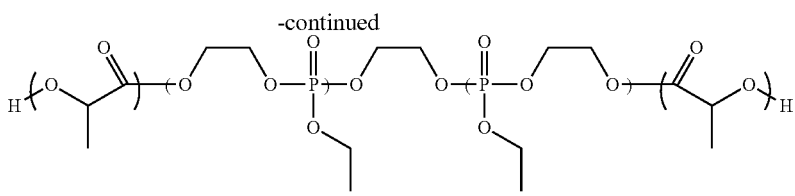
-continued

The ring opening polymerizations of reaction scheme 3 may be performed in the same manner as the ring opening polymerizations of reaction schemes 1 and 2.

One skilled in the art will appreciate that any suitable cyclic phosphoester may be utilized in the first step of reaction scheme 3 in lieu of, or in addition to, 2-ethoxy-2-oxy-1,3,2-dioxaphospholane. Suitable cyclic phosphoesters include, but are not limited to, 2-ethoxy-2-oxy-1,3,2-dioxaphospholane, 2-methyl-2-oxy-1,3,2-dioxaphospholane, and 2-ethoxy-4-methyl-2-oxy-1,3,2-dioxaphospholane.

Generally, a flame retardant ABA-type tri-block copolymer in accordance with some embodiments of the present invention may be synthesized using a cyclic phosphonate, but only if the first step is initiated from a diol (e.g., ethylene glycol or other suitable diol) to ensure that product is hydroxyl-telechelic.

FIG. 1 is a block diagram illustrating an exemplary printed circuit board (PCB) 100 having layers of dielectric material that incorporate a bio-derived flame retardant block copolymer in accordance with some embodiments of the present invention. In the embodiment illustrated in FIG. 1, the PCB 100 includes one or more module sites 105 and one or more connector sites 110. The configuration of the PCB 100 shown in FIG. 1 is for purposes of illustration and not limitation.

Figure 2:
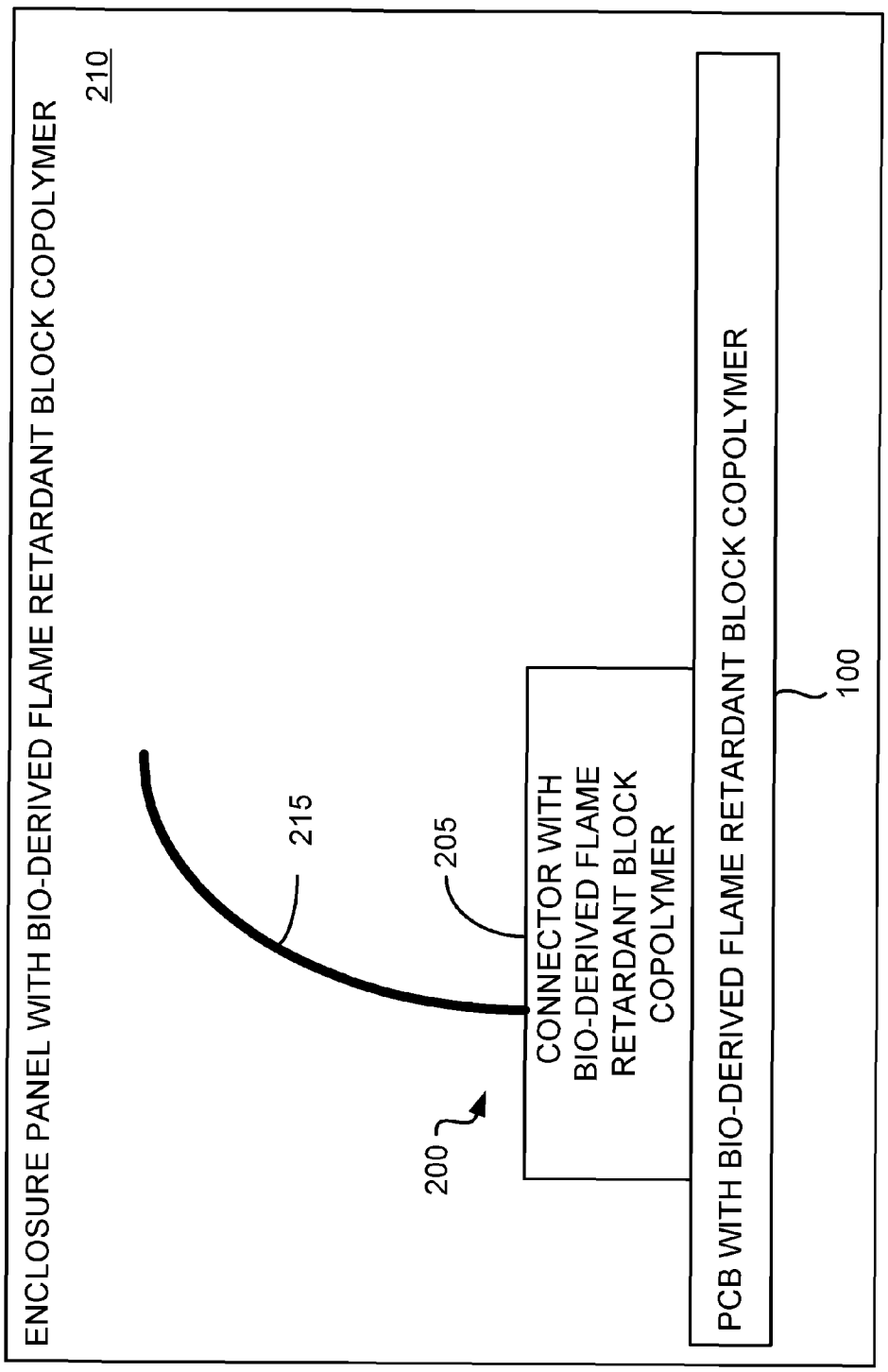
FIG. 2 is a block diagram illustrating an exemplary connector having a plastic housing and an exemplary plastic enclosure panel each of which incorporates a bio-derived flame retardant block copolymer in accordance with some embodiments of the present invention.

FIG. 2 is a block diagram illustrating an exemplary connector 200 having a plastic housing 205 and an exemplary plastic enclosure panel 210 that incorporate a bio-derived flame retardant block copolymer in accordance with some embodiments of the present invention. In the embodiment illustrated in FIG. 2, the connector 200 is configured to make electrical contact with the connector site 110 (shown in FIG. 1) of the PCB 100. Also in the embodiment illustrated in FIG. 2, the connector 200 includes a cable 215. The configuration of the connector 200 and the configuration of the plastic enclosure panel 210 shown in FIG. 2 are for purposes of illustration and not limitation.

In accordance with some embodiments of the present invention, a bio-derived flame retardant block copolymer is incorporated into the plastic housing 205 to impart flame retardancy. The bio-derived flame retardant block copolymer may be blended, for example, with the base material of the plastic housing 205.

In accordance with some embodiments of the present invention, a bio-derived flame retardant block copolymer is incorporated into the plastic enclosure panel 210 to impart flame retardancy. The bio-derived flame retardant block copolymer may be blended, for example, with the base material of the plastic enclosure panel 210.

One skilled in the art will appreciate that many variations are possible within the scope of the present invention. Thus, while the present invention has been particularly shown and described with reference to preferred embodiments thereof, it will be understood by those skilled in the art that these and other changes in form and details may be made therein without departing from the spirit and scope of the present invention.

What is claimed is:

1. A flame retardant block copolymer, comprising:
   a ring opening polymerization reaction product of a biobased cyclic ester and a phosphorus-containing polymer.

2. The flame retardant block copolymer as recited in claim 1, wherein the phosphorus-containing polymer comprises a hydroxyl-telechelic flame retardant biopolymer prepared by a polycondensation reaction of a biobased diol and a phosphorus-containing monomer, wherein at least 50% of the mass of the biobased diol is obtained directly from a biological product.

3. The flame retardant block copolymer as recited in claim 2, wherein the hydroxyl-telechelic flame retardant biopolymer is a cyclic phosphonate.

4. The flame retardant block copolymer as recited in claim 3, wherein the cyclic phosphonate is represented by the following formula:

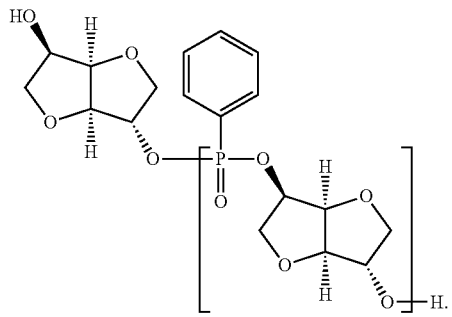

5. The flame retardant block copolymer as recited in claim 1, wherein the biobased cyclic ester comprises lactide.

6. The flame retardant block copolymer as recited in claim 1, wherein the flame retardant block copolymer is represented by the following formula:

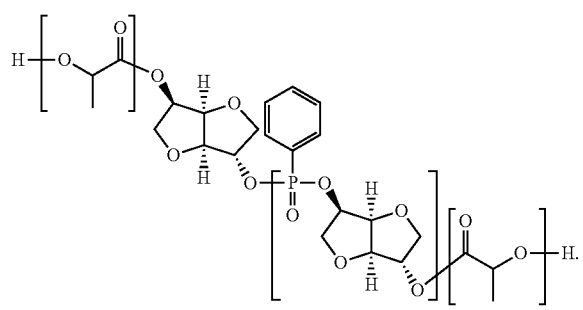

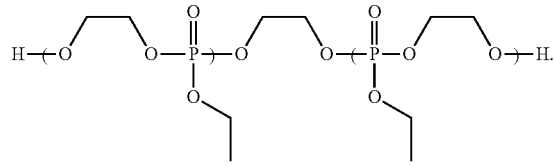

11. The flame retardant block copolymer as recited in claim 1, wherein the biobased cyclic ester comprises lactide, wherein the phosphorus-containing polymer comprises a hydroxyl-telechelic flame retardant biopolymer, and the ring opening polymerization reaction product is represented by the following formula:

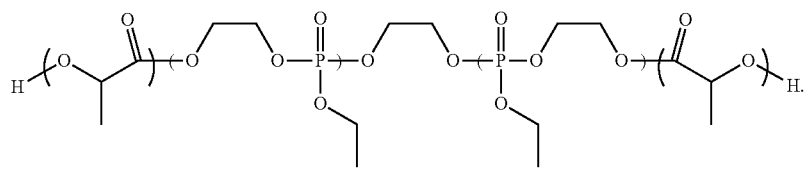

7. The flame retardant block copolymer as recited in claim 1, wherein the phosphorus-containing polymer comprises a polyphosphoester synthesized from a ring opening polymerization of a dioxaphospholane initiated from a diol.

8. The flame retardant block copolymer as recited in claim 3, wherein the cyclic phosphonate is represented by the following formula:

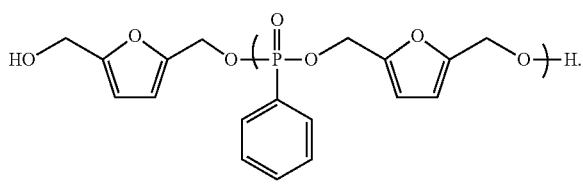

9. The flame retardant block copolymer as recited in claim 1, wherein the biobased cyclic ester comprises lactide, wherein the phosphorus-containing polymer comprises a hydroxyl-telechelic flame retardant biopolymer, and the ring opening polymerization reaction product is represented by the following formula:

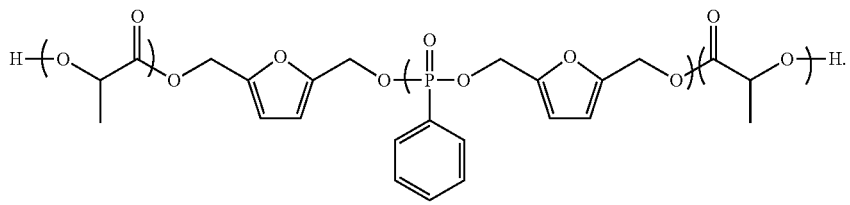

10. The flame retardant block copolymer as recited in claim 7, wherein the polyphosphoester is represented by the following formula:

12. A flame retardant block copolymer, comprising:
a ring opening polymerization reaction product of a biobased cyclic ester and a phosphorus-containing polymer, wherein the biobased cyclic ester is selected from a group consisting of lactide, glycolide, and combinations thereof, wherein the phosphorus-containing polymer comprises a hydroxyl-telechelic flame retardant biopolymer prepared by a polycondensation reaction of a biobased diol and a phosphorus-containing monomer, wherein the biobased diol is selected from a group consisting of 1,4:3,6-dianhydrohexitols (DAHs), 2,5-bis(hydroxymethyl)furan, ethylene glycol, propylene glycol, 1,3-propanediol, glycerol, 2,3-butanediol, and combinations thereof, and wherein the phosphorus-containing monomer is selected from a group consisting of phenylphosphonic dichloride, ethylphosphonic dichloride, methylphosphonic dichloride, methylenebis(phosphonic dichloride), phenyl dichlorophosphate (PDCP), ethyl dichlorophosphate, methyl dichlorophosphate, and combinations thereof.

13. A flame retardant block copolymer, comprising:
a ring opening polymerization reaction product of a biobased cyclic ester and a phosphorus-containing polymer, wherein the biobased cyclic ester is selected from a group consisting of lactide, glycolide, and combinations thereof, wherein the phosphorus-containing polymer comprises a polyphosphoester synthesized from a ring opening polymerization of a dioxaphospholane initiated from a diol, wherein the dioxaphospholane is selected from a group consisting of 2-ethoxy-2-oxy-1,3,2-dioxaphospholane, 2-methyl-2-oxy-1,3,2-dioxaphospholane, 2-ethoxy-4-methyl-2-oxy-1,3,2-dioxaphospholane, and combinations thereof.

* * * * *